US008769371B2

(12) United States Patent
Zheng et al.

(10) Patent No.: US 8,769,371 B2
(45) Date of Patent: Jul. 1, 2014

(54) INTER-SEQUENCE PERMUTATION TURBO CODE SYSTEM AND OPERATION METHODS THEREOF

(75) Inventors: Yan-Xiu Zheng, Shulin (TW); Yu-Ted Su, Hsinchu (TW)

(73) Assignee: Industrial Technology Research Institute (TW)

( * ) Notice: Subject to any disclaimer, the term of this patent is extended or adjusted under 35 U.S.C. 154(b) by 1032 days.

(21) Appl. No.: 12/434,601

(22) Filed: May 1, 2009

(65) Prior Publication Data

US 2009/0217133 A1  Aug. 27, 2009

Related U.S. Application Data

(62) Division of application No. 11/176,829, filed on Jul. 7, 2005, now abandoned.

(51) Int. Cl.
  *G06F 11/00* (2006.01)
(52) U.S. Cl.
  USPC .......................................................... 714/755
(58) Field of Classification Search
  USPC .......................................................... 714/755
  See application file for complete search history.

(56) References Cited

U.S. PATENT DOCUMENTS

| | | |
|---|---|---|
| 4,400,768 A | 8/1983 | Tomlinson |
| 5,224,100 A | 6/1993 | Lee et al. |
| 5,530,707 A | 6/1996 | Lin |
| 5,734,962 A | 3/1998 | Hladik et al. |
| 5,815,515 A | 9/1998 | Dabiri |
| 6,044,116 A | 3/2000 | Wang |
| 6,477,680 B2 | 11/2002 | Mujtaba |
| 6,553,516 B1 | 4/2003 | Suda et al. |
| 6,603,412 B2 | 8/2003 | Gatherer et al. |
| 6,618,371 B1 | 9/2003 | Cao |
| 6,728,927 B2 | 4/2004 | Crozier |
| 6,745,362 B1 | 6/2004 | Carlach et al. |

(Continued)

FOREIGN PATENT DOCUMENTS

| EP | 0 179 401 A2 | 4/1986 |
|---|---|---|
| EP | 0 313 787 A2 | 5/1989 |

OTHER PUBLICATIONS

U.S. Appl. No. 11/513,158, Notice of Allowance of Jul. 6, 2010.
U.S. Appl. No. 11/414,433, Notice of Allowance of Aug. 3, 2010.

(Continued)

*Primary Examiner* — Scott Baderman
*Assistant Examiner* — Jigar Patel
(74) *Attorney, Agent, or Firm* — Alston & Bird LLP

(57) ABSTRACT

A high performance real-time turbo code system is proposed. The proposed system exploits cooperative coding architecture and a proper decoding scheduling to achieve low error rate within a constrained latency. Permutation schemes and hardware embodiments utilizing the cooperative coding are also shown. Various memory saving techniques are provided to reduce memory usage in both encoder and decoder. The proposed system is compatible with $3^{rd}$ generation mobile standards and cost of designing new parts exclusively for the proposed system can be minimized. This invention can provide substantial coding and system capacity gains for real-time applications in a wireless environment.

20 Claims, 7 Drawing Sheets

(56) References Cited

U.S. PATENT DOCUMENTS

| | | | |
|---|---|---|---|
| 6,845,482 B2 | 1/2005 | Yao et al. | |
| 6,944,727 B2 | 9/2005 | Yokokawa | |
| 6,957,375 B2 | 10/2005 | Richardson | |
| 6,961,888 B2 | 11/2005 | Jin et al. | |
| 7,058,874 B2 | 6/2006 | Zhou | |
| 7,137,044 B2 | 11/2006 | Ha et al. | |
| 7,155,642 B2 | 12/2006 | Han | |
| 7,180,968 B2 | 2/2007 | Miyauchi et al. | |
| 2002/0159423 A1* | 10/2002 | Yao et al. | 370/342 |
| 2003/0002474 A1 | 1/2003 | Alexander et al. | |
| 2003/0041293 A1 | 2/2003 | Zheng et al. | |
| 2003/0058954 A1 | 3/2003 | He | |
| 2003/0154343 A1 | 8/2003 | Yokokawa | |
| 2005/0071727 A1 | 3/2005 | Zheng et al. | |
| 2005/0071728 A1 | 3/2005 | Zheng et al. | |
| 2005/0076286 A1 | 4/2005 | Zheng et al. | |
| 2005/0111473 A1* | 5/2005 | Cuylen et al. | 370/418 |
| 2005/0195742 A1* | 9/2005 | Klipper et al. | 370/235 |
| 2005/0216700 A1 | 9/2005 | Honary et al. | |
| 2006/0039555 A1 | 2/2006 | Lee et al. | |
| 2007/0011557 A1 | 1/2007 | Zheng et al. | |
| 2007/0089019 A1* | 4/2007 | Tang et al. | 714/752 |
| 2007/0255849 A1 | 11/2007 | Zheng | |
| 2009/0077431 A1 | 3/2009 | Zheng | |
| 2011/0090364 A1* | 4/2011 | Alvarez et al. | 348/222.1 |

OTHER PUBLICATIONS

Shimizu, S. et al., *A New Addressing Scheme With Reorganizable Memory Structure Basic Principle*, Transactions of the I.E.C.E. of Japan, vol. E65, No. 8, Aug. 1982, pp. 464-471.

Harper, D. T. et al., *Performance Evaluation of Vector Accesses in Parallel Memories Using a Skewed Storage Scheme*, The 13$^{th}$ Annual International Symposium on Computer Architecture, Tokyo, Jun. 1986, pp. 324-328.

Langmaid, R. N., *Versatile Programmable Logic Array*, IBM Technical Disclosure Bulletin, vol. 25, No. 8, Jan. 1983, pp. 4445-4449.

3GPP TS 25.212 version 3.1.1, Multiplexing and channel coding [FDD], Dec. 1999.

Mansour, M., *Unified Decoder Architecture for Repeat-Accumulate and LDPC Codes*, 38$^{th}$, Asilomar Conference on Signals, Systems and Computers, Nov. 2004, pp. 527-531.

Berro, C., et al. "Near Shannon Limit Error-Correcting Coding and Decoding: Turbo-Codes (1)" *IEEE* (1993) pp. 1064-1070.

Zheng, Y., et al. "On Inter-Block Permutation and Turbo Codes" *3$^{rd}$ International Symp. Turbo Codes and Related Topics* (2003).

Zheng, Y., et al. "Interactive Decoding Algorithm and Terminating Criteria for Inter-Block Permuted Turbo Codes" *The 15$^{th}$ IEEE International Symposium on Personal, Indoor and Mobile Radio Communications* (PIMRC 2004) vol. 2, pp. 1116-1120.

\* cited by examiner

INTER-SEQUENCE PERMUTATION TURBO CODE SYSTEM AND OPERATION METHODS THEREOF

RELATED APPLICATION

This application is a divisional of and hereby claims the priority benefit to U.S. patent application Ser. No. 11/176,829 filed Jul. 7, 2005, incorporated herein by reference in its entirety.

BACKGROUND OF THE INVENTION

1. Field of the Invention

The present invention relates to a turbo code system, more specifically, a turbo code system utilizing cooperative coding architecture and a proper decoding scheduling to achieve high performance real-time encoding and coding.

2. Description of Related Art

Turbo Code (TC) was invented in 1993, which renders extraordinary, near Shannon limit performance by applying the iterative decoding algorithm. Following researches on the area of Forward Error-Control (FEC) were inspired from this primitive code structure and decoding algorithm. We shall thus refer to any FEC system that utilizes the principle of turbo code in decoding as a Turbo Code System (TCS).

Codeword length influences the performance of TCS. TCS with long codeword length performs excellently but decoder of the TCS has large decoding latency and hardware complexity. Moreover, the decoder requires considerable number of iterations to achieve desired performance. The TCS with moderate codeword length often gives unsatisfactory performance. The TCS with short codeword length (say <200) often only provides performance worse than that of conventional coding schemes.

Therefore, the conventional TCS renders high complexity, long decoding latency and large memory space consumption; thereby diminishing their applicability. Commercial FEC applications require affordable complexity, low decoding latency and low power consumption. Furthermore, for use in a future generation wireless communication system, it is preferred that any new enhancement be backward compatible with current air interface standard. It will be shown in the following that the present invention does satisfy all these requirements.

SUMMARY OF THE INVENTION

Cooperative decoding can improve performance of TCS with short codeword length. Besides, conventional A Posteriori Probability (APP) decoding modules and interleaving techniques can be applied and the feature of "Backward Compatible" is attainable. More than one schedulers can be applied for scheduling of cycles of APP decoding (or called APP decoding runs) or memory releasing.

Inter-Sequence Permutation (ISP) is a concept permuting between different sequences, and decoder of TCS can apply ISP to do cooperative decoding. A long sequence of codeword can be chopped into shorter sequences first, and by utilizing ISP, these shorter sequences can be subsequently decoded at decoder side simultaneously so as to achieve the goal of parallel decoding. The ISP algorithm permuting these sequences can be simple and require little effort. TCS applying ISP concept is called cooperative TCS and a turbo code applying the ISP concept is called ISP turbo code.

The proposed ISP turbo code can incorporate existing TC. Encoders of existing devices only need minor modification upon introducing the ISP permutation technique. CRC and BCH codes or the like are optional for termination test or error correction.

Memory usage would be the most critical implementation problem for the cooperative TCS. Decoding more than ten sequences at the same time requires large memory space for the temporary received samples. Moreover, an ISP between sequences also requires buffers storing probability measure for the nearby sequences. In the present invention, a termination test is used to halt decoding. In cooperative TCS, the termination test can be further used for providing more reliable probability measure and releasing memory. In summary, the termination test reduces power consumption and decoding latency, assists in the decoding of the other sequences, and makes the utilization of memory economic.

Proposed dynamic memory assignment decoder architecture can: i) reducing the average decoding latency and the computation power consumption; ii) minimizing the memory usage; iii) lowering down the average iterations at high error rate region; iv) parallel decoding; v) effective utilizing the APP decoders.

Physical architecture of the ISP turbo code system of the present invention comprises two parts, which are an ISP turbo code encoder and an ISP turbo code decoder.

The ISP turbo code encoder is used for generating a pre-permutation sequence output before an ISP and a post-permutation sequence output after the ISP from a sequence input, characterized in comprising an ISP interleaver within, wherein the said ISP interleaver is composed by an inter-sequence permuter and at least one conventional sequence permuter arranged in a one-by-one manner; and wherein the inter-sequence permuter of the ISP interleaver performing ISP comprises at least an ISP control unit and a memory pool, furthermore, an ISP algorithm is permanently embedded or temporally recorded in the ISP control unit controlling inputting to the memory pool, outputting from the memory pool, and execution of ISP between sequences stored in the memory pool.

The ISP turbo code decoder receiving the pre-permutation sequence output and post-permutation sequence output transmitted by the said ISP turbo code encoder, wherein the said ISP turbo code decoder decodes the said sequences by at least one a posteriori probability (APP) decoder therein, characterized in that decoding runs of the APP decoder is controlled by at least one scheduler and the decoding runs are performed in a loop manner so that the APP decoder can repeatedly be used in decoding.

Details of apparatus and operations mentioned above will be discussed in more detail below.

BRIEF DESCRIPTION OF THE DRAWINGS

The present invention is described below by way of examples with reference to the accompanying drawings which will make it easier for readers to understand the purpose, technical contents, characteristics and achievement of the present invention.

DETAILED DESCRIPTION OF THE INVENTION

The details to the exemplary embodiments of the invention will be described as follows and the same reference numbers are used throughout the drawings to refer to the same or like parts.

Figure 1:
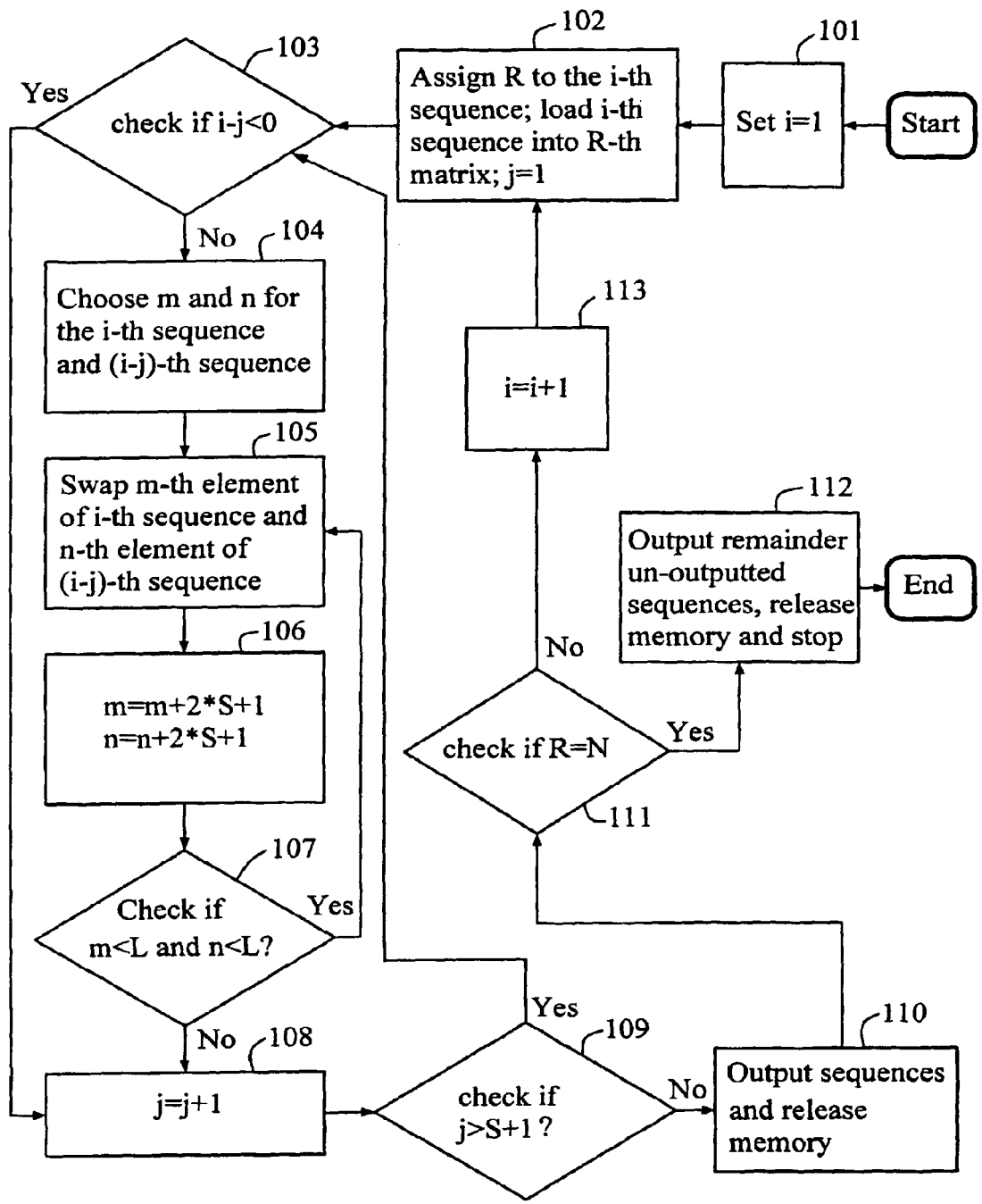
FIG. 1 is an operation flowchart of an example of inter-sequence permutation.

As stated above, ISP is a concept permuting between different sequences, which is easy to be comprehended for persons skilled in the art. For ease of understanding, taking the sequences as matrices, one element in one matrix, if it is to be swapped, will be swapped with only one element in another matrix. One element will not swap with another element in the same matrix, or with more than one element. In the present invention, preferably, one sequence is to be inter-sequence permuted with two other sequences which are consecutively before and after the sequence to be permuted. One exemplary procedure of ISP is given in FIG. 1, wherein i is ordinal number of sequences, R and P are ordinal numbers of matrices, m and n are ordinal numbers of elements in the R-th and P-th matrices, respectively, j is a variable used in following operations, M is memory size (in term of maximum number of sequences stored), S is a variable called ISP span which S<M−1, and N is total number of sequences, as follows:

step 101: set initial value of i=1; then go to step 102;
step 102: Assign R for the i-th sequence, where R-th matrix is not in use;
Register R-th matrix as in-use, load i-th sequence to R-th matrix with length L;
j=1; then go to step 103;
step 103: if i−j<0, then go to step 108; otherwise, go to step 104;
step 104: choose m and n for the i-th and (i−j)-th sequences, respectively, so that one element only swaps with one element of another sequence throughout the ISP process; then go to step 105;
step 105: swap m-th element of I-th sequence and n-th element of (i−j)-th sequence; then go to step 106;
step 106: m=m+2*S+1 and n=n+2*S+1; then go to step 107;
step 107: if m<L and n<L, then go to step 105; otherwise, go to step 108;
step 108: j=j+1; then go to step 109;
step 109: if j>S+1, then go to step 103; otherwise, go to step 110;
step 110: output sequences done by ISP and register the matrix corresponding to outputted sequence as non-use; then go to step 111;
step 111: if R=N, then output remaining un-outputted sequences, register the matrix corresponding to outputted sequence non-use and stop (step 112);
otherwise, i=i+1 (step 113) then go to step 102;

One should understand that the above example is just an illustration of one possible ISP algorithm. Many ISP algorithms are available to be used as long as they meet the definitions (one element in one matrix, if it is to be swapped, will be swapped . . . . In the present invention, preferably . . . one sequence . . . before and after the sequence to be permuted.)

Figure 2:
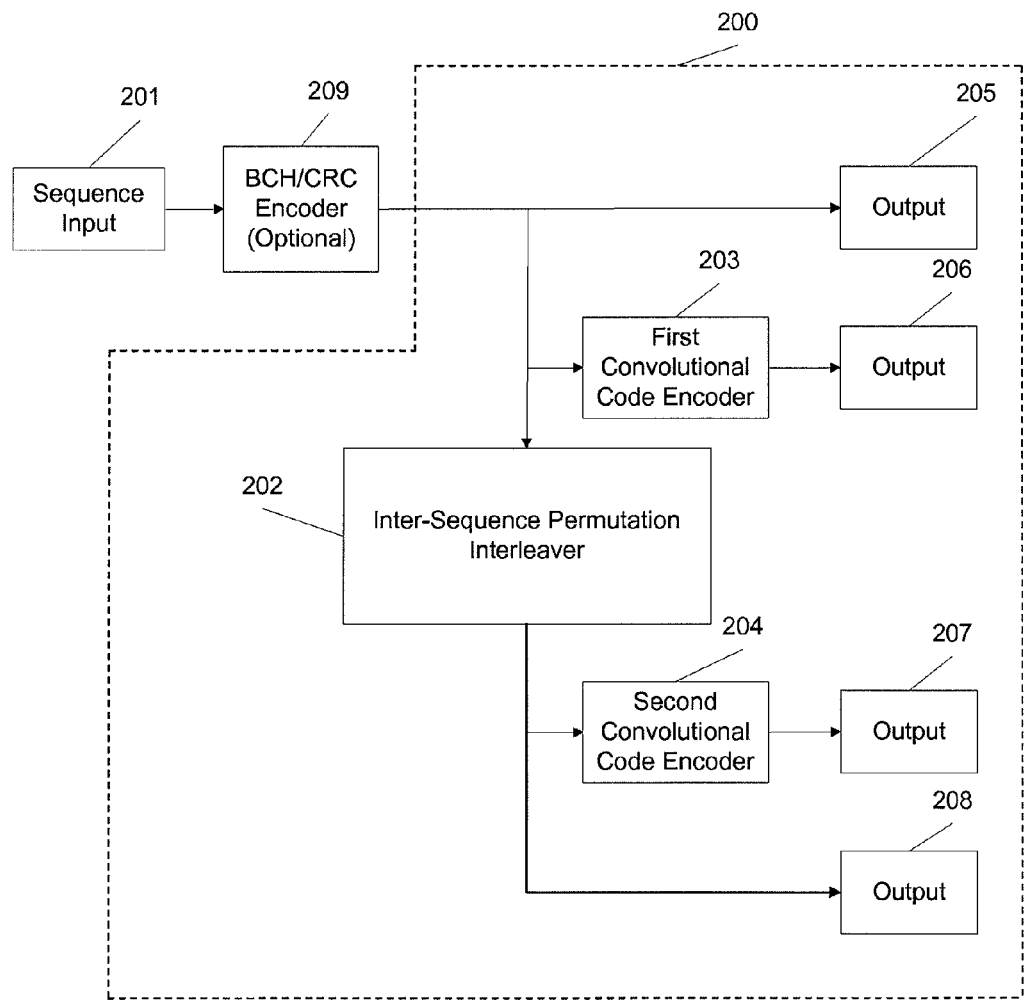
FIG. 2 is a schematic drawing of an example of ISP turbo code encoder.

As illustrated in FIG. 2, is a schematic drawing showing a typical ISP turbo code encoder 200 according to the present invention. The ISP turbo code encoder generates a pre-permutation codeword sequence output before an ISP, and a post-permutation codeword sequence output after the ISP from a sequence input 201, characterized by comprising an ISP interleaver 202 therein.

Illustrated in FIG. 3, the ISP interleaver 202 comprises at least an inter-sequence permuter 302 and may comprise one or more conventional sequence permuters arranged in a one-by-one manner, which will be discussed more in detail below. The inter-sequence permuter 302 of the ISP interleaver 202 performing ISP comprises at least an ISP control unit and a memory pool; furthermore, an ISP algorithm is permanently embedded or temporally recorded in the ISP control unit controlling inputting to the memory pool, outputting from the memory pool, and execution of ISP between sequences stored in the memory pool.

Four possible classes of arrangement of the ISP interleaver 202 are illustrated, as follows:

Class I: comprising a first sequence permuter 301 utilizing a conventional sequence permuting algorithm, the inter-sequence permuter 302, and a second sequence permuter 303 utilizing a conventional sequence permuting algorithm, wherein the conventional sequence permuting algorithm utilized in the first sequence permuter 301 and second sequence permuter 303 can be different or identical, and a sequence inputted into the ISP interleaver 202 is processed in the order of the first sequence permuter 301, the inter-sequence permuter 302, and then the second sequence permuter 303.

Class II: comprising the inter-sequence permuter 302 and a second sequence permuter 303 utilizing a conventional sequence permuting algorithm, wherein a sequence inputted into the ISP interleaver 202 is processed in the order of the inter-sequence permuter 302 and then the second sequence permuter 303.

Class III: comprising a first sequence permuter 301 utilizing a conventional sequence permuting algorithm and the inter-sequence permuter 302, wherein a sequence inputted into the ISP interleaver 202 is processed in the order of the first sequence permuter 301 and then the inter-sequence permuter 302.

Class IV: comprising the inter-sequence permuter, wherein a codeword sequence inputted into the ISP interleaver is processed by the inter-sequence permuter.

Back to FIG. 2, the ISP turbo code encoder 200 comprises the ISP interleaver 202 and two convolutional code encoders, namely a first convolutional code encoder 203 and a second convolutional code encoder 204, located in portions of the ISP turbo code encoder 200 before and after the ISP interleaver 202, respectively.

As illustrated in the drawing, the pre-permutation codeword sequence output comprises two sequence outputs, which are the sequence output 205 of "original sequence from the sequence input" and sequence output 206 of "original sequence processed by the first convolutional code encoder 203." Similarly, the post-permutation sequence output comprises two sequence outputs, which are the sequence output 207 of "original sequence processed by and in the order of the ISP interleaver 202 and the second convolutional code encoder 204", and the sequence output 208 of "original sequence processed by the ISP interleaver 202."

In practical application, only three sequence outputs out from the four sequence outputs 205, 206, 207 and 208 above-mentioned are required, which can be chosen from only one of the two sets of sequence outputs: codeword sequence outputs 205, 206 and 207, or codeword sequence outputs 208, 207 and 206.

Further, as illustrated in FIG. 2, the ISP turbo code encoder 200 is further provided with an optional encoder 209 located between the sequence input 201 and the ISP turbo code encoder 200. For example, the encoder 209 can be a BCH or CRC encoder.

Figure 4:
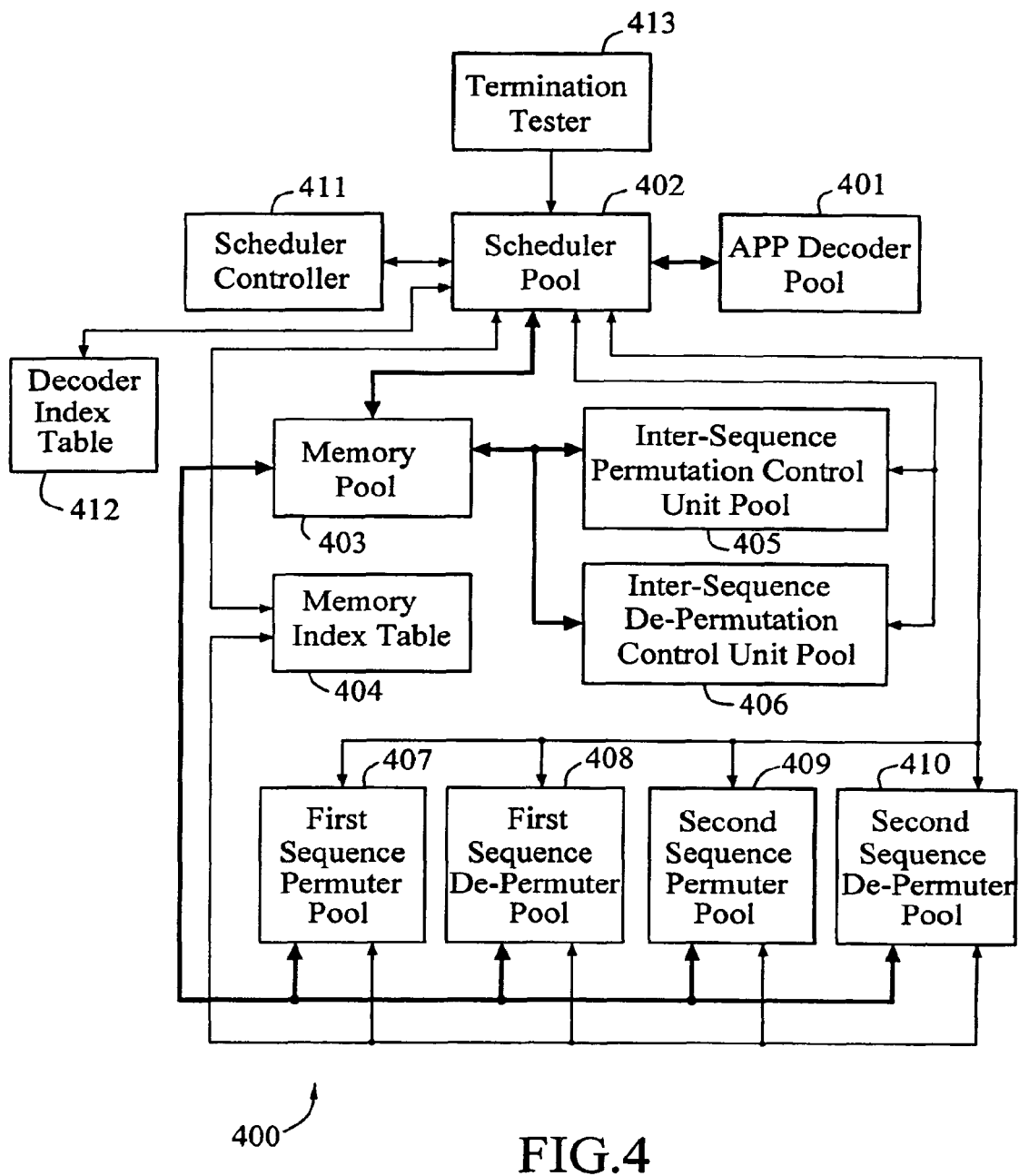
FIG. 4 is a schematic drawing of an example of ISP turbo code decoder.

Now, please refer to FIG. 4 for an embodiment of an ISP turbo code decoder 400. The present invention employs a distributed design so as to attain the goal of do-loop operation.

The decoder 400 comprises an APP decoder pool 401 composed of at least one APP decoder; a scheduler pool 402 composed of at least one scheduler; a memory pool 403 composed of a plurality of memory units storing sequences; a memory index table 404 storing relationship information between the memory units and received sequences and location of a specific sequence in the memory pool can be located by this table; an ISP control unit pool 405 composed of at least one ISP control unit; an inter-sequence de-permutation (ISDP) control unit pool 406 composed of at least one ISDP control unit; a first sequence permuter pool 407 composed of at least one first sequence permuter; a first sequence de-permuter pool 408 composed of at least one first sequence de-permuter; a second sequence permuter pool 409 composed of at least one second sequence permuter; and a second sequence de-permuter pool 410 composed of at least one second sequence de-permuter. A de-permuter runs like a permuter in reverse manner.

Wherein the scheduler pool 402 controls operations of the APP decoder pool 401, the ISP control unit pool 405, the ISDP control unit pool 406, the first sequence permuter pool 407, the first sequence de-permuter pool 408, the second sequence permuter pool 409 and the second sequence de-permuter pool 410. In detail, a scheduler controls each cycle of APP decoding (hereafter referred to as an "APP decoding run"), which relates to ISP, ISDP, conventional sequence permutation, or related arithmetic operation. Schedulers will be coordinated so that preferably all components in the ISP turbo code decoder 400 work and cooperate seamlessly. It will be discussed in more detail later.

The scheduler pool 402 provides and retrieves sequences into and from the memory pool 403. The scheduler pool 402 provides and retrieves sequences to and from the APP decoder pool 401. The scheduler pool 402 updates and retrieves information to and from the decoder index table 412 and memory index table 404. The ISP control unit pool 405 and ISDP control unit pool 406 interchange sequences with the memory pool 403. The first sequence permuter pool 407, the first sequence de-permuter pool 408, the second sequence permuter pool 409, and the second sequence de-permuter pool 410 interchange sequences with the memory pool 403. The scheduler pool 402 comprises at least one adder 610 and subtracter 611 (both are not shown in FIG. 4).

Note that in all drawings in this specification, thick lines, e.g. between the APP decoder pool 401 and scheduler pool 402, represent bus for transmitting sequences/control signals, and narrow lines, e.g. between the scheduler controller 411 and scheduler pool 402, represent signal lines for transmitting control signals only.

Also note that arrangement of this embodiment would be modified according to the ISP interleaver 202 used in the ISP turbo code encoder 200. What is illustrated is only for ISP interleaver 202 of Class I of FIG. 3. If ISP interleaver 202 of Class II in FIG. 3 is used, the first sequence permuter pool 407 and the first sequence de-permuter pool 408 are not required. If ISP interleaver 202 of Class III in FIG. 3 is used, the second sequence permuter pool 409 and the second sequence de-permuter pool 410 are not required. If ISP interleaver 202 of Class IV in FIG. 3 is used, the first sequence permuter pool 407, the first sequence de-permuter pool 408, the second sequence permuter pool 409 and the second sequence de-permuter pool 410 are all not required.

FIG. 4 only illustrates relative relations between components therein. Therefore, no signal input/output is indicated. Operations of the components comprising signal input/output will be illustrated in FIG. 6.

Further, the adder and subtracter can be replaced by a multiplier and a divider respectively in accordance to scale or format of the sequences. For instance, if values in sequences are in logarithm-based, an adder and a subtracter are used.

Figure 5:
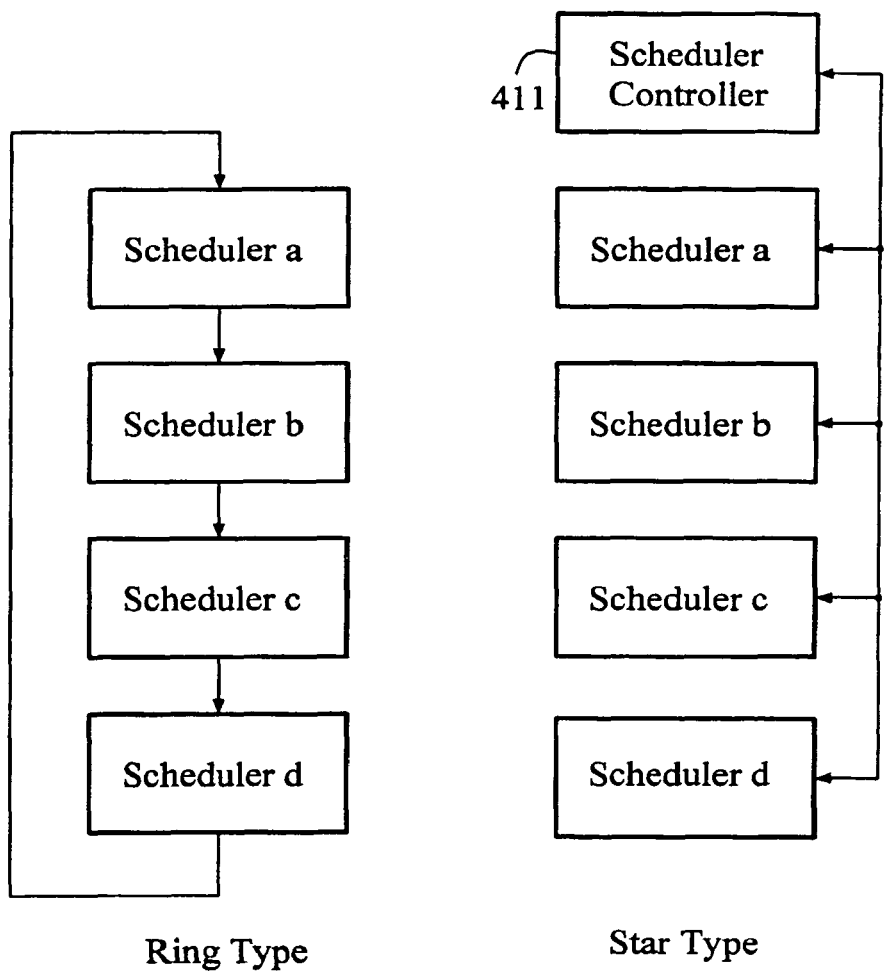
FIG. 5 is a schematic drawing showing two types of scheduler arrangements.

With reference to FIG. 5, schedulers in the scheduler pool 402 can be arranged in "ring type" or "star type", as illustrated. In the ring type, one scheduler is controlled by commands transmitted by a preceding scheduler. If the star type is used, a scheduler controller 411 is required, which is connected to all schedulers and coordinates operation of all schedulers. Operation of schedulers will be discussed in detail later.

Further, at least one decision maker 603 (shown in FIG. 6) for outputting a hard decoding output sequence is included in the scheduler pool 402. A "hard decoding output" is one kind of digitally altered decoding output of which all values are bits (symbols), so that ambiguous values are eliminated.

Further, the ISP turbo code decoder 400 comprises a decoder index table 412 for storing information on the relationship between necessity to perform APP decoding and codeword sequence numbers. The decoder index table at least is connected and interchanges information with the scheduler pool 402. If a codeword sequence is marked as "unnecessary", then it will not go through APP decoding.

The scheduler pool 402 is connected to at least one termination tester 413 for performing a termination test, which is a test to check correctness or convergence of a sequence. Conventional tests such as CRC and sign check can be used.

Figure 6:
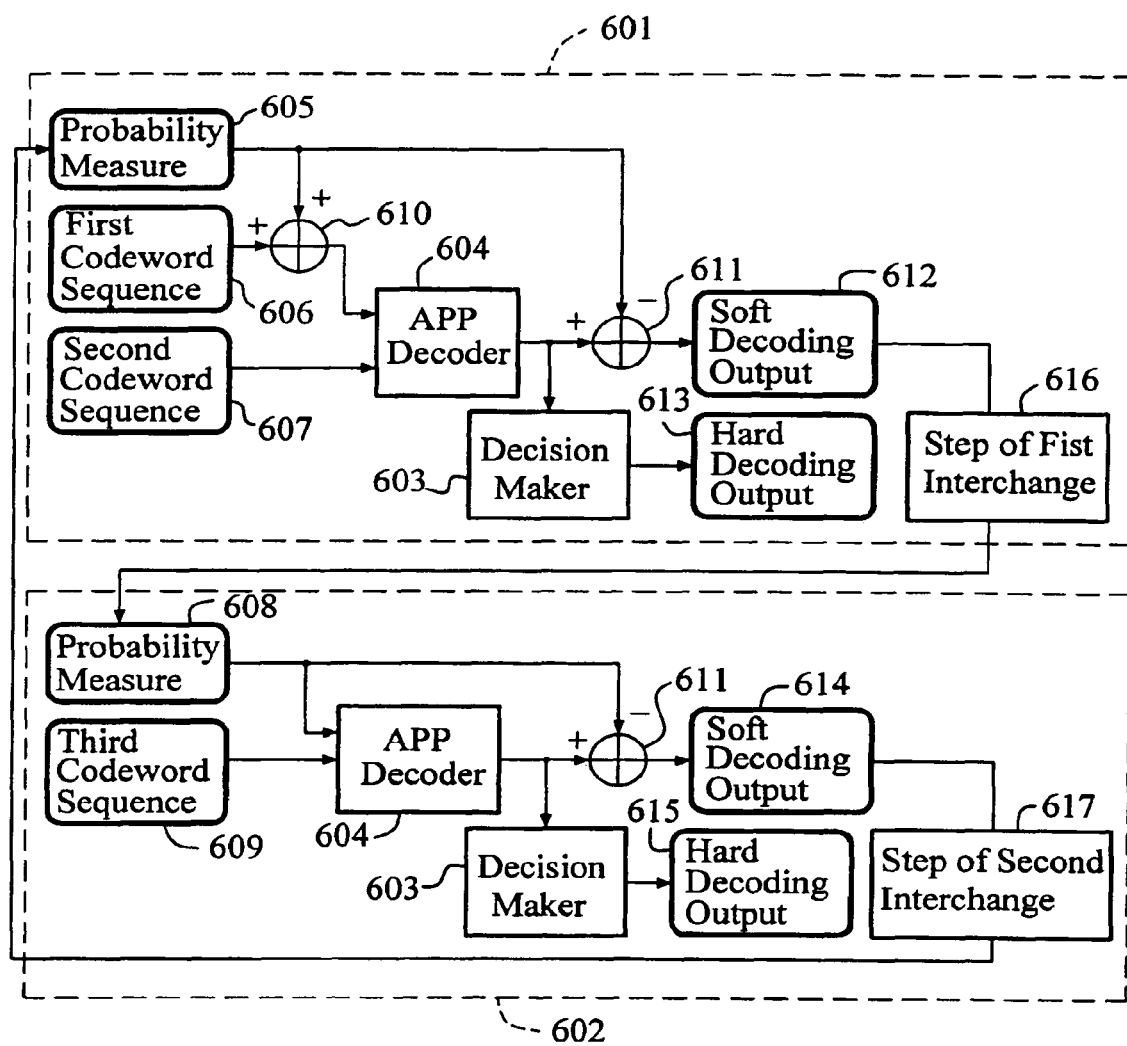
FIG. 6 is a schematic drawing showing an example of operations of odd-numbered and even-numbered APP decoding runs.

Refer to FIG. 6 for a method of operation of APP decoding runs. An APP decoding run block 601 illustrates operation of odd-numbered APP decoding run which works on odd-numbered codeword sequences, and an APP decoding run block 602 illustrates operation of even-numbered APP decoding run which works on even-numbered codeword sequences.

If the three codeword sequence outputs from the ISP turbo code encoder 200 are sequence output 205, sequence output 206, and sequence output 207, then a pre-permutation codeword sequence received from the ISP turbo code encoder, i.e. original codeword sequence from the codeword sequence input and original codeword sequence processed by the first convolutional code encoder, is processed in odd-numbered APP decoding runs and post-permutation codeword sequence received from the ISP turbo code encoder, i.e. original codeword sequence processed by and in the order of the ISP interleaver and the second convolutional code encoder, is processed in even-numbered APP decoding runs.

The original codeword sequence from the codeword sequence input is called a first codeword sequence 606, the original codeword sequence processed by the first convolutional code encoder is called a second codeword sequence 607, and the original codeword sequence processed by and in the order of the ISP interleaver and the second convolutional code encoder is called a third codeword sequence 609.

For odd-numbered APP decoding run, it comprises the following steps:

Step of first APP decoder input: a first input of the APP decoder 604 is calculated by combining a sequence of a priori probability measure 605 and the first codeword sequence 606 through an adder 610 of the scheduler pool 402, and then the process goes to the step of second APP decoder input.

Step of second APP decoder input: the second codeword sequence 607 is inputted into the APP decoder 604 as a second input, and then the process goes to the step of outputting first result.

Step of outputting first result: the APP decoder 604 outputs a first result probability measure sequence and then the process goes to the step of generating first soft decoding output;

step of generating first soft decoding output: a first sequence of soft decoding output 612 is calculated by eliminating the sequence of a priori probability measure 605 from the first result probability measure sequence through a subtracter 611 of the scheduler pool 402, and then the process goes to the step of first interchange 616;

step of first interchange 616 (details will be given later): the first sequence of soft decoding output 612 is the sequence of a priori probability measure 608 of subsequent even-numbered APP decoding run. However, since even-numbered APP decoding runs works on post-permutation codeword sequences, permutation must be performed on the first sequence of soft decoding output 612 before it can be used in the subsequent even-numbered APP decoding run.

For even-numbered APP decoding run, it comprises the following steps:

Step of third APP decoder input: an APP decoder 604 receives two inputs which are the sequence of a priori probability measure 608 in step of first interchange and the third codeword sequence 609, and outputs a second result probability measure sequence, wherein the APP decoder 604 can be or not be the same one as used in the odd-numbered APP decoding run; then the process goes to the step of outputting second result.

Step of outputting second result: a second sequence of soft decoding output 614 is calculated by eliminating the sequence of a priori probability measure 608 in the step of first interchange or the step of third APP decoder input from the second result probability measure sequence through the subtracter 611 of the scheduler pool, which can be or not be the same as used in the odd-numbered APP decoding run, and then the process goes to the step of second interchange 617.

Step of second interchange 617 (details will be given later): the second sequence of soft decoding output 614 is the sequence of a priori probability measure 605 of subsequent odd-numbered APP decoding run. However, since odd-numbered APP decoding runs works on pre-permutation codeword sequences, de-permutation must be performed on the second sequence of soft decoding output 614 before it can be used in subsequent odd-numbered APP decoding run.

Alternatively, if the three codeword sequence outputs from the ISP turbo code encoder are sequence output 206, sequence output 207, and sequence output 208, then pre-permutation codeword sequence received from the ISP turbo code encoder, i.e. original codeword sequence processed by the first convolutional code encoder, is processed in even-numbered APP decoding runs and post-permutation codeword sequence received from the ISP turbo code encoder, i.e. original codeword sequence processed by and in the order of the ISP interleaver and the second convolutional code encoder, and original codeword sequence processed by the ISP interleaver, is processed in odd-numbered APP decoding runs.

The original sequence processed by the ISP interleaver 202 is called a first codeword sequence 606, the original codeword sequence processed by and in the order of the ISP interleaver and the second convolutional code encoder is called a second codeword sequence 607, and the original codeword sequence processed by the first convolutional code encoder is called a third codeword sequence 609, For odd-numbered APP decoding run, it comprises the following steps:

Step of first APP decoder input: a first input of the APP decoder 604 is calculated by combining a sequence of a priori probability measure 605 and the first codeword sequence 606 through an adder 610 of the scheduler pool 402, and then the process goes to step of second APP decoder input.

Step of second APP decoder input: the second codeword sequence 607 is inputted into the APP decoder 604 as a second input, and then the process goes to the step of outputting first result.

Step of outputting first result: the APP decoder 604 outputs a first result probability measure sequence, and then the process goes to the step of generating first soft decoding output.

Step of generating first soft decoding output: a first codeword sequence of soft decoding output 612 is calculated by eliminating the sequence of a priori probability measure 605 from the first result probability measure sequence through a subtracter 611 of the scheduler pool 402, and then the process goes to the step of first interchange 616;

step of first interchange 616 (details will be given later): the first sequence of soft decoding output 612 is the sequence of a priori probability measure 608 of subsequent even-numbered APP decoding run. However, since even-numbered APP decoding runs works on pre-permutation codeword sequences, de-permutation must be performed on the first sequence of soft decoding output 612 before it can be used in the subsequent even-numbered APP decoding run.

For even-numbered APP decoding run, it comprises the following steps:

Step of third APP decoder input: an APP decoder 604 receives two inputs which are the sequence of a priori probability measure 608 in step of first interchange and the third codeword sequence 609 and outputs a second result probability measure sequence, wherein the APP decoder 604 can be or not be the same one as used in the odd-numbered APP decoding run; then the process goes to the step of outputting second result.

Step of outputting second result: a second sequence of soft decoding output 614 is calculated by eliminating the sequence of a priori probability measure 608 in the step of first interchange or the step of third APP decoder input from the second result probability measure sequence through the subtracter 611 of the scheduler pool 402, which can be or not be the same as used in the odd-numbered APP decoding run, and then the process goes to the step of second interchange 617;

Step of second interchange 617 (details will be given later): the second sequence of soft decoding output 614 is the sequence of a priori probability measure 605 of subsequent odd-numbered APP decoding run. However, since odd-numbered APP decoding runs works on post-permutation codeword sequences, permutation must be performed on the second sequence of soft decoding output 614 before it can be used in subsequent odd-numbered APP decoding run.

Figure 3:
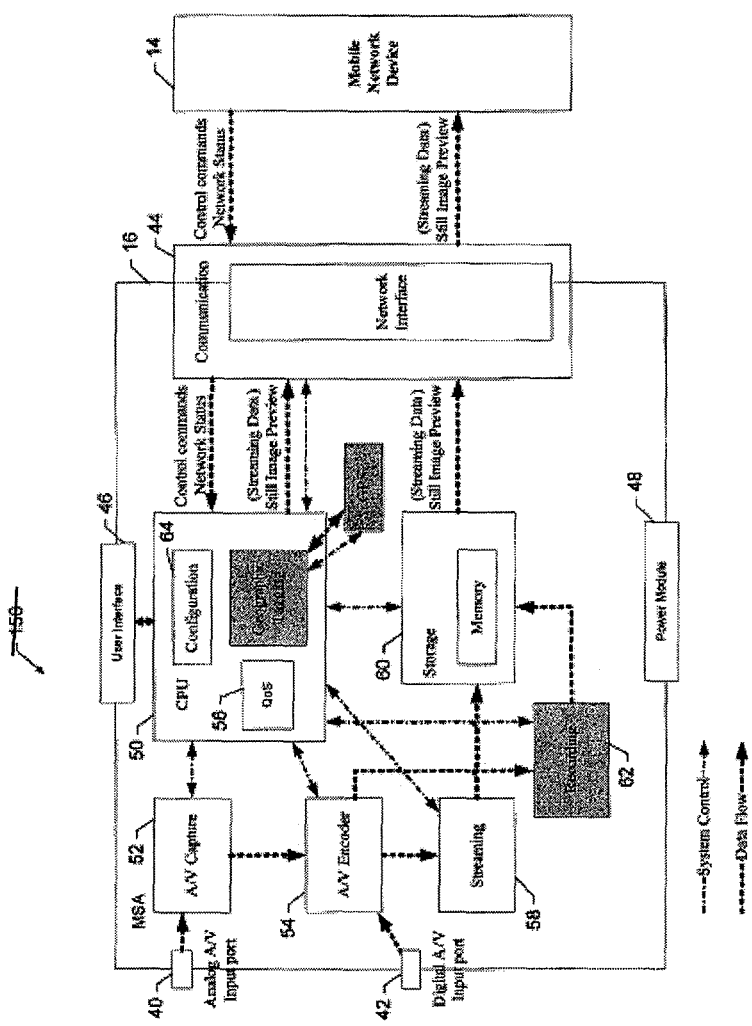
FIG. 3 is a schematic drawing showing four possible arrangements of an ISP interleaver.

In the step of first interchange 616 and the step of second interchange 617, "permutation" is performed according to any one of four classes of the ISP interleaver 202 used in the ISP turbo code encoder 200, as follows:

If the ISP interleaver 202 of Class I in FIG. 3 is used in encoder side, the permutation is performed by and in the order of a first sequence permuter 301 in the first sequence permuter pool 407, an ISP control unit in the ISP control unit pool 405 which works with the memory pool 403, and a second sequence permuter 303 in the second sequence permuter pool 409, in the process of the ISP interleaver 202.

If the ISP interleaver 202 of Class II in FIG. 3 is used in encoder side, the permutation is performed by and in the order of an ISP control unit works in the ISP control unit pool 405 which works with the memory pool 403, and a second sequence permuter 303 in the second sequence permuter pool 409, in the process of the ISP interleaver 202.

If the ISP interleaver 202 of Class III in FIG. 3 is used in encoder side, the permutation is performed by and in the order of a first sequence permuter 301 in the first sequence permuter pool 407, and an ISP control unit in the ISP control unit pool 405 which works with the memory pool 403, in the process of the ISP interleaver 202.

If the ISP interleaver 202 of Class IV in FIG. 3 is used in encoding side, the permutation is performed by an ISP control unit in the ISP control unit pool 405 which works with the memory pool 403.

The "de-permutation" performed in the step of second interchange 617 or step of first interchange 616 is performed according to any one of four classes of the ISP interleaver 202 used in the ISP turbo code encoder 200, as follows:

If the ISP interleaver 202 of Class I in FIG. 3 is used in encoder side, the de-permutation is performed by and in the order of a second sequence de-permuter in the second sequence de-permuter pool 410, an ISDP control unit in the ISDP control unit pool 406 which works with the memory pool 403, and a first sequence de-permuter in the first sequence de-permuter pool 408, in the reverse process of the ISP interleaver 202.

If the ISP interleaver 202 of Class II in FIG. 3 is used in encoder side, the de-permutation is performed by and in the order of a second sequence de-permuter in the second sequence de-permuter pool 410, and an ISDP control unit in the ISDP control unit pool 406 which works with the memory pool 403, in the reverse process of the ISP interleaver 202.

If the ISP interleaver 202 of Class III in FIG. 3 is used in encoder side, the de-permutation is performed by and in the order of an ISDP control unit in the ISDP control unit pool 406 which works with the memory pool 403, and a first sequence de-permuter in the first sequence de-permuter pool 408, in the reverse process of the ISP interleaver 202.

If the ISP interleaver 202 of Class IV in FIG. 3 is used in encoding side, the de-permutation is performed by an ISDP control unit in the ISDP control unit pool 406 which works with the memory pool 403.

As stated above, the adder 610 and subtracter 611 can be replaced by a multiplier and a divider respectively in accordance with scale or format of the sequences. For example, an adder and a substracter are used when values in a sequence is in logarithm-based.

Figure 7:
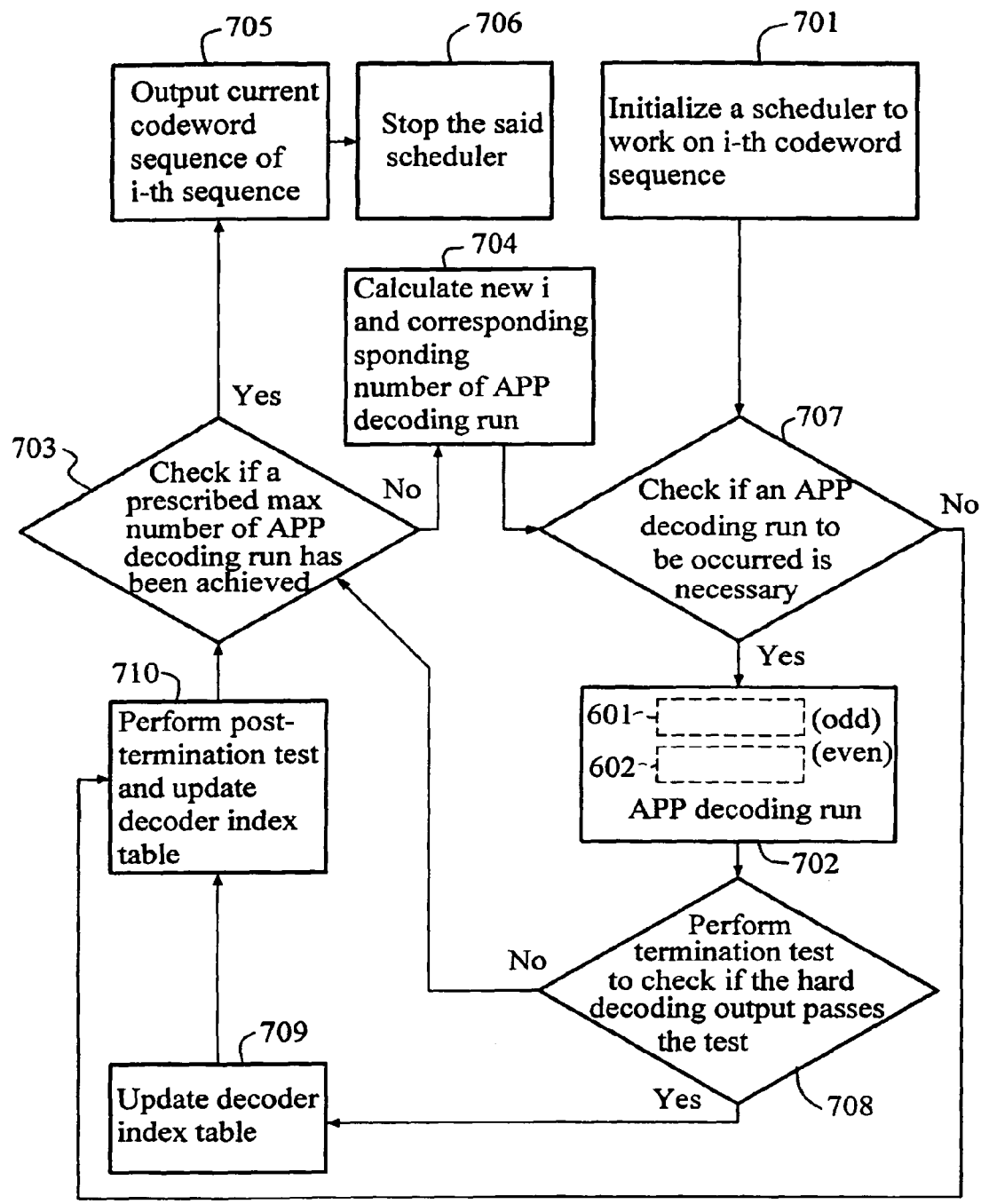
FIG. 7 is a schematic drawing showing an example of operations of scheduling formed by a scheduler.

Finally referring to FIG. 7, in order to control APP decoding runs by a scheduler, further steps in combination with the steps illustrated in FIG. 6 are further utilized. Essential steps of the further steps are described as follows:

Step of initialization 701: a scheduler in the scheduler pool 402 is initialized to work on the i-th codeword sequence, and then the process goes to the step of APP decoding run 702.

Step of APP decoding run 702: an APP decoding run of the block 601 or 602 is performed, and then the process goes to the step of checking maximum APP decoding run 703.

Step of checking maximum APP decoding run 703: if a prescribed maximum number of APP decoding run has been achieved is checked; if achieved, the process goes to the step of first outputting 705; if not achieved, the process goes to step of phasing 704.

Step of first outputting 705: since no more APP decoding run is available, an output result of the i-th codeword sequence is outputted if the result has not been outputted yet, and then the process goes to step of stopping 706.

step of stopping 706: stop the said scheduler;

Step of phasing 704: new value of i and corresponding number of APP decoding run are calculated so that all sequences will go through all numbers of APP decoding runs, and then the process goes to the step of APP decoding run 702.

To save time and resources, a termination test can be introduced. The test accelerates the speed to obtain a result. The test comprises the following steps:

Step of first necessity check 707: the step 707 is performed between step 701 and step 702. According to the decoder index table 412, if an APP decoding run to be occurred is required is checked. The scheduler can check necessity for performing APP decoding of related sequences. If the APP decoding run to be occurred is required, the process goes to the step 702. If the APP decoding run to be occurred is not required, the process goes to the step 703. If step 707 exists, then the process goes to the step 707 directly instead of the step 702.

The step of first decision making (not shown in FIG. 7) is performed between the step of outputting first result of FIG. 6 and the step of generating first soft decoding output of FIG. 6. Further, the first probability measure result sequence is inputted into the decision maker 603 of the scheduler pool and a first hard decoding output 613 is outputted. If the sequence outputs of ISP turbo code encoder are original sequence processed by the first convolutional code encoder, original codeword sequence processed by and in the order of the ISP interleaver and the second convolutional code encoder, and original codeword sequence processed by the ISP interleaver, the first hard decoding output should be performed de-permutation because termination test which will be discussed below at step 708 can only work with sequences without permutation;

The step of second decision making (not shown in FIG. 7) is performed between the step of third APP decoder input of FIG. 6 and the step of outputting second result of FIG. 6. Further, the second result probability measure sequence is inputted into a decision maker 603 and outputted as a second hard decoding output 615. If the sequence outputs of the ISP turbo code encoder are original codeword sequence from the sequence input, original sequence processed by the first convolutional code encoder, and original sequence processed by and in the order of the ISP interleaver and the second convolutional code encoder, the second hard decoding output should be performed de-permutation because termination test which will be discussed below at step 708 can only work with sequences without permutation;

The decision maker 603 can be employed in odd-numbered APP decoding run block 601, even-numbered decoding run block 602, or both. Thus the step of first decision making and the step of second decision making need not exist consecutively. Further, the "de-permutation" is performed in accordance with type of ISP interleaver used in encoder side, as follows:

If the ISP interleaver of Class I in FIG. 3 is used in encoder side, as a result, the de-permutation is performed by and in the order of a second sequence de-permuter in the second sequence de-permuter pool, an ISDP control unit in the ISDP control unit pool which works with the memory pool, and a first sequence de-permuter in the first sequence de-permuter pool, in the reverse process of the ISP interleaver.

If the ISP interleaver of Class II in FIG. 3 is used in encoder side, the de-permutation is performed by and in the order of a second sequence de-permuter in the second sequence de-permuter pool, and an ISDP control unit in the ISDP control unit pool which works with the memory pool, in the reverse process of the ISP interleaver.

If the ISP interleaver of Class III in FIG. 3 is used in encoder side, the de-permutation is performed by and in the order of an ISDP control unit in the ISDP control unit pool which works with the memory pool, and a first sequence de-permuter in the first sequence de-permuter pool, in the reverse process of the ISP interleaver.

If the ISP interleaver of Class IV in FIG. 3 is used in encoder side, the de-permutation is performed by an ISDP control unit in the ISDP control unit pool which works with the memory pool.

Following, the step of termination test 708 is performed between step 702 and step 703. The termination test, which could be a conventional CRC test, is performed. That is, if the hard decoding outputs passes the test is checked. If the test is passed, then the process go to the step of updating 709. If the test is not passed or the APP decoding run block 601, 602 does not have a hard decoding output, then the process goes to the step of checking maximum APP decoding run 703.

The step of updating 709 updates the decoder index table 412 corresponding to pre-permutation codeword sequence according to a result of the termination test in the step 708. Then the process goes to the step of checking maximum APP decoding run 703.

In step 708, if the probability measure sequence of hard decoding output 613 or 615 from the decision maker is passed the test, then the probability measure sequence of hard decoding output 613 or 615 can be directly outputted or used to calibrate the codeword sequence of soft decoding output 612 or 614, respectively.

Further, a step of post-termination test 710 is performed between the step 709 and step 703. A post-termination test is performed in the step 710. That is, to check the decoder index table 412 if the post-permutation codeword sequence is required for successive APP decoding, and result thereof is used to update the decoder index table corresponding to the post-permutation codeword sequence. Then the process goes to the step of checking maximum APP decoding run 703;

If the step of post-termination test 710 exists, then the process goes to the step 710 after step 707 when the APP decoding run to be occurred is not required. Also the process goes to the step 710 after step 709.

In steps of termination test 708 and post-termination test 710, the result of termination test and post-termination test can be used to release unnecessary information in the memory pool such as the codeword sequences and the probability measure sequences.

The operation illustrated in FIG. 7 take advantage of schedulers and/or termination/post-termination tests, wherein schedulers can perform parallel processing on sequences, as illustrated in the "ring type" arrangement of schedulers for example, after initialization of the decoder, scheduler a receives first sequence and works on first APP decoding run thereof. After completion of the first APP decoding run, scheduler a passes information to scheduler b and scheduler b continues working on second APP decoding run of the first sequence, while the scheduler a receives a new sequence, and so on. We can see that schedulers are arranged to work on different sequences and different APP decoding runs in parallel automatically, which is one technical effect of the present invention. What illustrated above is one preferred operation of schedulers and of course modifications can be done by persons skilled in the art.

Further, termination tests can mark sequences as "unnecessary to perform APP decoding" so that if all preceding sequences of a sequence to be performed are marked as "unnecessary to perform APP decoding, the APP decoding run to be performed can be skipped to save time and code sequences can be released in advance to save resources.

Note that for ease of understanding, routine operations which are convention techniques such as memory capacity check and release are omitted in steps above. Persons skilled in the art should practice this invention with necessary modifications without departing from scope of the present invention.

What is claimed is:

1. A turbo code system comprising:
    an inter-sequence permutation turbo code decoder, the inter-sequence permutation turbo code decoder including:
        a scheduler pool including at least one scheduler configured to receive a codeword sequence;
        an a-posteriori probability decoder pool, including an a-posteriori probability decoder configured to decode the codeword sequence in an a-posteriori probability decoding run;
        a memory pool to store sequences; and
        an inter-sequence permutation control unit pool having at least one inter-sequence permutation control unit, the at least one inter-sequence permutation control unit configured to use an inter-sequence permutation algorithm and interchange sequences with the memory pool, wherein the inter-sequence permutation algorithm is embedded in the inter-sequence permutation control unit to control inputting to the memory pool and outputting from the memory pool, and
    wherein the scheduler is configured to control operations of the a-posteriori probability decoder pool and control the a-posteriori probability decoding run of the received codeword sequence.

2. The turbo code system as claimed in claim 1, further comprising at least one pair of sequence permuter pools and at least on pair of sequence de-permuter pools, wherein the pair of sequence permuter pools and the pair of sequence de-permuter pools interchange sequences with the memory pool.

3. The turbo code system as claimed in claim 1, further comprising at least one adder and one subtractor.

4. The turbo code system as claimed in claim 1, further comprising at least one multiplier and one divider.

5. The turbo code system as claimed in claim 1, wherein the at least one scheduler is arranged as a ring type.

6. The turbo code system as claimed in claim 1, wherein the at least one scheduler is arranged in a star type.

7. The turbo code system as claimed in claim 6, further comprising a scheduler controller coupled to the at least one scheduler in the scheduler pool.

8. The turbo code system as claimed in claim 1, wherein the scheduler pool further comprises at least one decision maker configured to output a hard decoding output sequence.

9. The turbo code system as claimed in claim 1, wherein the inter-sequence permutation turbo code decoder further comprises a decoder index table storing information on relationship between necessity to perform a-posteriori probability decoding and codeword sequence numbers, the decoder index table coupled to the scheduler pool and configured to interchange information with the scheduler pool.

10. The turbo code system as claimed in claim 1, the scheduler pool coupled to at least one termination tester to perform a termination test.

11. The turbo code system as claimed in claim 1, further comprising an inter-sequence de-permutation control unit pool, the inter-sequence de-permutation control unit pool including at least one inter-sequence de-permutation control unit, the at least one inter-sequence de-permutation control unit using an inter-sequence de-permutation algorithm and interchanging sequences with the memory pool.

12. A turbo code system comprising:
an inter-sequence permutation turbo code decoder configured to receive a pre-permutation codeword sequence output and a post-permutation codeword sequence output, the inter-sequence permutation turbo code decoder including:
an a-posteriori probability decoder pool configured to decode the received pre-permutation codeword sequence output and the post-permutation codeword sequence output in an a-posteriori probability decoding run;
a memory pool to store sequences;
a scheduler pool including at least one scheduler, the at least one scheduler configured to provide and retrieve sequences to and from the a-posteriori probability decoder pool and the memory pool, wherein the scheduler is configured to control operations of the a-posteriori probability decoder pool and control the a-posteriori probability decoding run of the received pre-permutation codeword sequence output and post-permutation codeword sequence output;
an inter-sequence permutation control unit pool having at least one inter-sequence permutation control unit, wherein an inter-sequence permutation algorithm is embedded in the inter-sequence permutation control unit to control inputting to the memory pool and outputting from the memory pool; and
an inter-sequence de-permutation control unit pool having at least one inter-sequence de-permutation control unit, the at least one inter-sequence permutation control unit and the at least one inter-sequence de-permutation control unit configured to use the inter-sequence permutation algorithm and to interchange sequences with the memory pool.

13. The turbo code system as claimed in claim 12, wherein the at least one scheduler is arranged as a ring type.

14. The turbo code system as claimed in claim 12, wherein the at least one scheduler is arranged in a star type.

15. The turbo code system as claimed in claim 12, wherein the scheduler pool further comprises at least one decision maker configured to output a hard decoding output sequence.

16. The turbo code system as claimed in claim 12, the scheduler pool coupled to at least one termination tester to perform a termination test.

17. A turbo code system comprising:
an inter-sequence permutation turbo code decoder configured to receive a pre-permutation codeword sequence output and a post-permutation codeword sequence output, the inter-sequence permutation turbo code decoder including:
an a-posteriori probability decoder pool having at least one a-posteriori probability decoder, the at least one a-posteriori probability decoder configured to decode the received pre-permutation codeword sequence output and the post-permutation codeword sequence output;
a memory pool to store sequences;
a scheduler pool including at least one scheduler, the at least one scheduler configured to provide and retrieve sequences to and from the a-posteriori probability decoder pool and the memory pool, wherein the scheduler is configured to control operations of the a-posteriori probability decoder pool and control the a-posteriori probability decoding run of the received pre-permutation codeword sequence output and post-permutation codeword sequence output;
a scheduler controller coupled to each scheduler in the scheduler pool to control the operation of the scheduler;
an inter-sequence permutation control unit pool having at least one inter-sequence permutation control unit, wherein an inter-sequence permutation algorithm is embedded in the inter-sequence permutation control unit to control inputting to the memory pool and outputting from the memory pool; and
an inter-sequence de-permutation control unit pool have at least one inter-sequence de-permutation control unit, the at least one inter-sequence permutation control unit and the at least one inter-sequence de-permutation control unit configured to use the inter-sequence permutation algorithm and to interchange sequences with the memory pool.

18. The turbo code system as claimed in claim 17, wherein the inter-sequence permutation turbo code decoder further comprises a decoder index table storing information on relationship between necessity to perform the a-posteriori probability decoding and codeword sequence numbers, the decoder index table coupled to the scheduler pool and configured to interchange information with the scheduler pool.

19. The turbo code system as claimed in claim 17, further comprising at least one pair of sequence permuter pools and sequence de-permuter pools, wherein the pair of sequence permuter pools and sequence de-permuter pools interchange sequences with the memory pool.

20. The turbo code system as claimed in claim 17, wherein the scheduler pool further comprises at least one decision maker configured to output a hard decoding output sequence.

* * * * *